United States Patent
Jou et al.

(10) Patent No.: US 11,196,249 B2
(45) Date of Patent: Dec. 7, 2021

(54) ELECTROSTATIC DISCHARGE (ESD) BLOCKING CIRCUIT

(71) Applicant: Vanguard International Semiconductor Corporation, Hsinchu (TW)

(72) Inventors: Yeh-Ning Jou, Hsinchu (TW); Jian-Hsing Lee, Puzih (TW); Shao-Chang Huang, Hsinchu (TW); Chih-Hsuan Lin, Hsinchu (TW); Hwa-Chyi Chiou, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 44 days.

(21) Appl. No.: 16/854,051

(22) Filed: Apr. 21, 2020

(65) Prior Publication Data

US 2021/0328425 A1   Oct. 21, 2021

(51) Int. Cl.
*H02H 9/04* (2006.01)
*G11C 17/18* (2006.01)

(52) U.S. Cl.
CPC ........... *H02H 9/045* (2013.01); *G11C 17/18* (2013.01)

(58) Field of Classification Search
CPC .......... H02H 9/045; H02H 9/04; G11C 17/18; H01L 27/0248
USPC ......................................................... 361/56
See application file for complete search history.

(56) References Cited

U.S. PATENT DOCUMENTS

| | | | | |
|---|---|---|---|---|
| 5,202,852 A | * | 4/1993 | Mizuta | G11C 17/18 235/492 |
| 2004/0196609 A1 | * | 10/2004 | Lin | H01L 27/0262 361/119 |
| 2009/0020844 A1 | * | 1/2009 | Park | H01L 27/0255 257/476 |
| 2009/0052102 A1 | * | 2/2009 | Wada | H02H 9/046 361/56 |
| 2017/0110170 A1 | * | 4/2017 | Kong | H01L 27/0288 |

FOREIGN PATENT DOCUMENTS

| | | |
|---|---|---|
| CN | 1558451 A | 12/2004 |
| TW | 200421589 A | 10/2004 |
| TW | 200913225 A | 3/2009 |
| TW | 201830711 A | 8/2018 |

OTHER PUBLICATIONS

Office Action of Taiwanese Application No. 109101277, dated Apr. 17, 2020.

* cited by examiner

*Primary Examiner* — Thienvu V Tran
*Assistant Examiner* — Sreeya Sreevatsa
(74) *Attorney, Agent, or Firm* — Birch, Stewart, Kolasch & Birch, LLP

(57) ABSTRACT

An electrostatic discharge (ESD) blocking circuit including an internal circuit, a first Schottky diode, and an ESD releasing element is provided. The first Schottky diode is coupled between a specific node and the internal circuit. The ESD releasing element is coupled between the specific node and the first power terminal. In response to an ESD event occurring at the specific node, the ESD releasing element is turned on to release the ESD current from the specific node to the first power terminal.

10 Claims, 5 Drawing Sheets

ELECTROSTATIC DISCHARGE (ESD) BLOCKING CIRCUIT

BACKGROUND OF THE DISCLOSURE

Field of the Disclosure

The disclosure relates to an electrostatic discharge (ESD) blocking circuit, and an ESD blocking circuit that comprises an ESD releasing element.

Description of the Related Art

The electrostatic discharge (ESD) event occurring in integrated circuits refers to the releasing process of electrostatic charges with high voltage through the integrated circuit wafer. Although the electrostatic charge that accumulates is usually not very large, the instantaneous energy that is produced during discharge is significant, due to the electrostatic charges having a high voltage. If it is not handled properly, it will often burn out the integrated circuit.

As semiconductor manufacturing evolves, ESD protection has become one of the most critical reliability issues for ICs. Generally, there are two types of tests for an ESD protection circuit: a machine model (MM) and a human body model (HBM). Commercial ICs must have certain tolerance in the MM or the HBM, otherwise an ESD event will easily damage the IC. Therefore, persons skilled in the field are concerned about how to create an efficient ESD protection device to protect ICs.

BRIEF SUMMARY OF THE DISCLOSURE

In accordance with an embodiment of the disclosure, an electrostatic discharge (ESD) blocking circuit comprises an internal circuit, a first Schottky diode, and an ESD releasing element. The first Schottky diode is coupled between a specific node and the internal circuit. The ESD releasing element is coupled between the specific node and a first power terminal. In response to an ESD event occurring at the specific node, the ESD releasing element is turned on to release the ESD current from the specific node to the first power terminal.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

Figure 1:
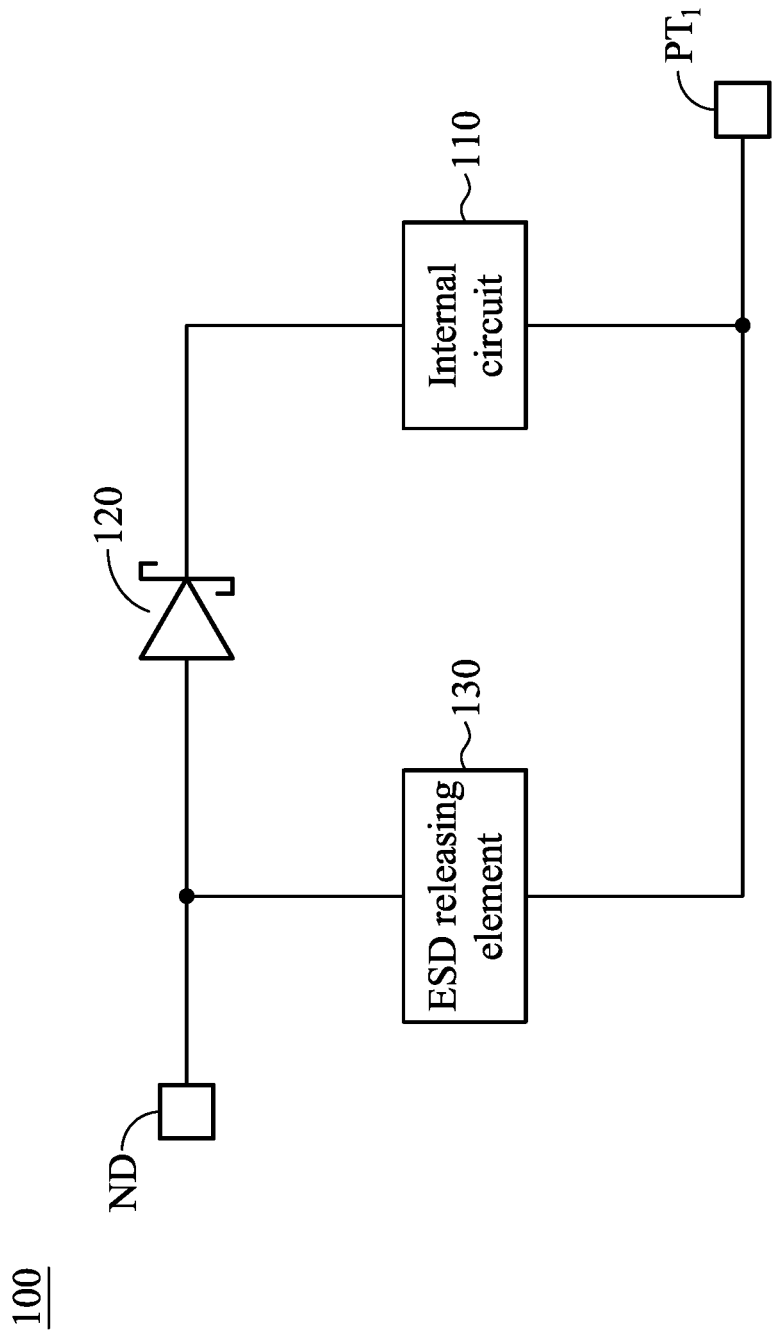
FIG. 1 is a schematic diagram of an exemplary embodiment of an electrostatic discharge (ESD) blocking circuit, according to various aspects of the present disclosure.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

FIG. 1 is a schematic diagram of an exemplary embodiment of an electrostatic discharge (ESD) blocking circuit, according to various aspects of the present disclosure. The ESD blocking circuit 100 comprises an internal circuit 110, a Schottky diode 120, and an ESD releasing element 130. The internal circuit 110 is coupled between the cathode of the Schottky diode 120 and a power terminal $PT_1$. The Schottky diode 120 is coupled to between a specific node ND and the internal circuit 110 to block the ESD current from entering the internal circuit 110 via the specific node ND. In this embodiment, the anode of the Schottky diode 120 is coupled to the specific node ND, and the cathode of the Schottky diode 120 is coupled to the internal circuit 110. The ESD releasing element 130 is coupled between the specific node ND and the power terminal $PT_1$ to release the ESD current.

When an ESD event occurs at the specific node ND and the power terminal $PT_1$ is coupled to a ground, the ESD blocking circuit 100 enters a protection mode. In the protection mode, the ESD releasing element 130 is turned on to release the ESD current from the specific node ND to the power terminal $PT_1$. In this embodiment, since the Schottky diode 120 has a high AC resistance, at the beginning of the ESD event, the Schottky diode 120 is not turned on. This prevents the ESD current from entering the internal circuit 110. In addition, since the trigger voltage of the ESD releasing element is lower than the sum of the trigger voltage of the Schottky diode 120 and the trigger voltage of the internal circuit 110, the ESD releasing element 130 turns on before the Schottky diode 120 does.

When the ESD event does not occur, the ESD blocking circuit 100 operates in a normal mode. In the normal mode, since the Schottky diode 120 has a lower DC resistance, when the specific node ND receives external signals or voltages, the Schottky diode 120 is turned on quick to transmit the external signals or the voltages to the internal circuit 110. In this embodiment, the internal circuit 110 operates according to the external signals or the voltages of the specific node ND. The disclosure does not limit the structure of the internal circuit 110. Any circuit can serve as an internal circuit 110, as long as the circuit needs ESD protection.

Figure 2:
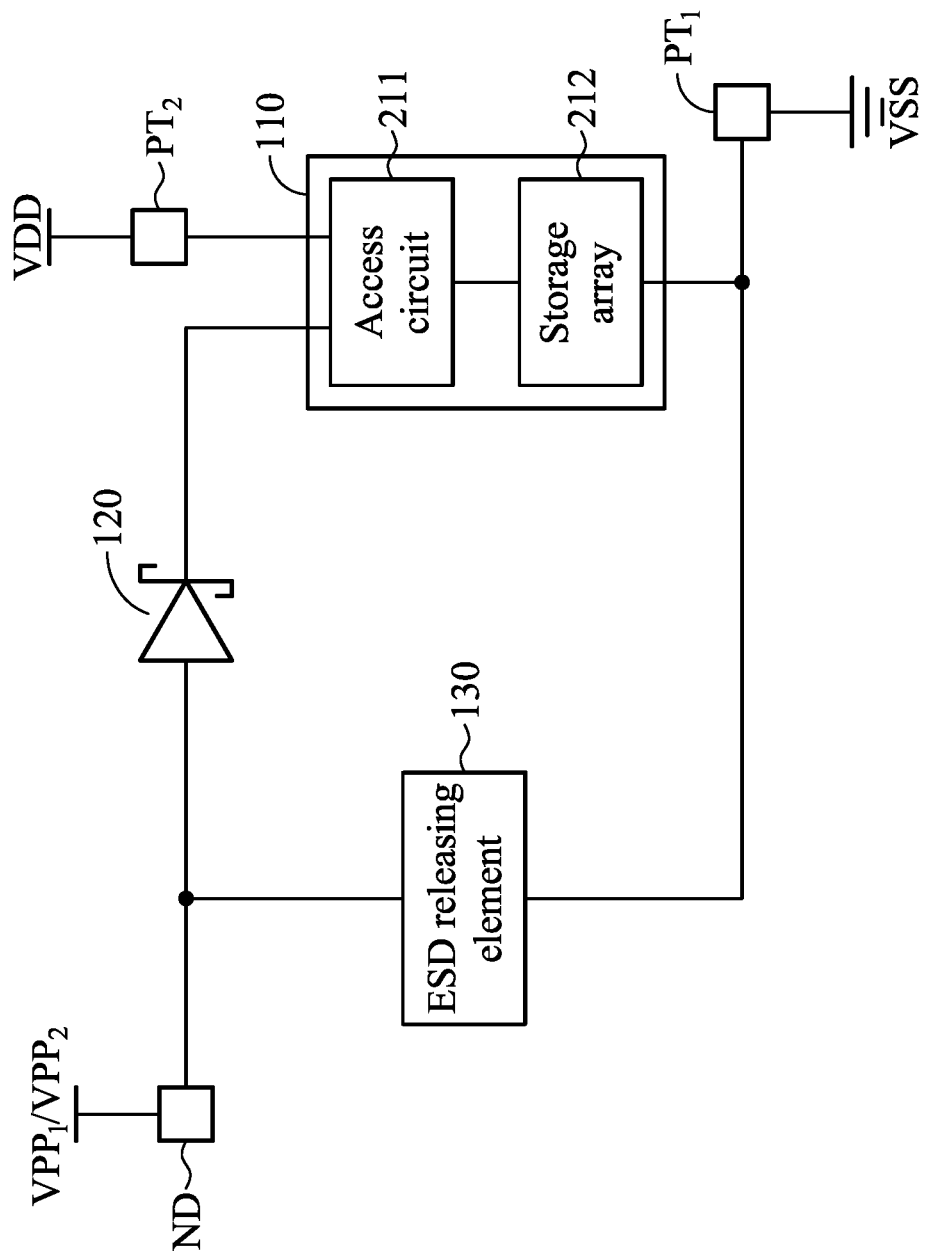
FIG. 2 is a schematic diagram of an exemplary embodiment of the ESD blocking circuit, according to various aspects of the present disclosure.

FIG. 2 is a schematic diagram of an exemplary embodiment of the ESD blocking circuit, according to various aspects of the present disclosure. In this embodiment, the specific node ND serves as an input node to provide signals or voltages to the internal circuit 110. In one embodiment, the specific node ND receives and provides voltage $VPP_1$ or $VPP_2$ to the internal circuit 110. Furthermore, the internal circuit 110 is further coupled to a power terminal $PT_2$. The power terminal $PT_2$ is configured to receive an operation voltage VDD. In this case, the power terminal $PT_1$ is configured to receive an operation voltage VSS. The operation voltage VDD is larger than the operation voltage VSS. In some embodiments, the operation voltage VSS is a negative voltage.

The internal circuit 110 operates according to the operation voltages VDD and VSS. In this embodiment, the operation voltages VDD and VSS serve as operation voltages for the internal circuit 110. Therefore, the operation voltages VDD and VSS need to be stabilized at a fixed value. For example, operation voltage VDD may be stabilized at 3.3V, and operation voltage VSS may be stabilized at 0V. When the operation voltages VDD and VSS are not stable, the internal circuit 110 may be not work normally.

Relative to the operation voltages VDD and VSS, the voltage of the specific node ND does not need to be stabilized at a fixed value. For an example, during a first period (e.g., a write period), the voltage of the specific node ND is equal to the voltage $VPP_1$, and during a second period (e.g., a read period), the voltage of the specific node ND is equal to the voltage $VPP_2$. In one embodiment, the voltage $VPP_1$ is higher than the voltage $VPP_2$.

The disclosure does not limit the structure of the internal circuit 110. In one embodiment, the internal circuit 110 is an one-time programmable (OTP) memory and comprises an access circuit 211 and a storage array 212.

The access circuit 211 is configured to access the storage array 212. The disclosure does not limit the structure of the access circuit 211. In one embodiment, the access circuit 211 performs a write operation for the storage array 212 according to the voltage $VPP_1$ to write the value 1 or 0 into the storage array 212. In another embodiment, the access circuit 211 performs a read operation for the storage array 212 according to the voltage $VPP_2$ to retrieve data stored in the storage array 212.

The storage array 212 comprises a plurality of cells (not shown). The disclosure does not limit the structure of the cells. In one embodiment, each cell of the storage array 212 comprises at least one transistor. Each transistor comprises a floating gate. During performing the write operation, the access circuit 211 provides the voltage $VPP_1$ to the corresponding cell such that the floating gate of the corresponding cell accumulates charges. In this case, when the floating gate of the corresponding cell accumulates enough charges, it means that the corresponding cell stores a first value (e.g., 1 or 0). When the floating gate of the corresponding cell does not have charges, it means that the corresponding cell stores a second value (e.g., 0 or 1).

In another embodiment, each cell of the storage array 212 comprises at least one transistor. In this case, the access circuit 211 may be use the voltage $VPP_1$ to puncture the gate oxide of the transistor of the corresponding cell. When the gate oxide is punctured, it means that the corresponding cell stores the first value. When the gate oxide is not punctured, it means that the corresponding cell stores the second value.

In other embodiments, each cell of the storage array 212 comprises at least one fuse. In this case, the access circuit 211 utilizes the voltage $VPP_1$ to blow the fuse of a corresponding cell. When the fuse of the corresponding cell is blown, it means that the corresponding cell stores the first value. When the fuse of the corresponding cell is not blown, it means that the corresponding cell stores the second value.

When an ESD event occurs at the specific node ND and the power terminal $PT_1$ is grounded, the ESD releasing element 130 is turned on to release the ESD current from the specific node ND to the power terminal $PT_1$. In this embodiment, since the Schottky diode 120 blocks the ESD current from entering the internal circuit 110, the access circuit 211 and the storage array 212 are not damaged by the ESD current.

Figure 3:
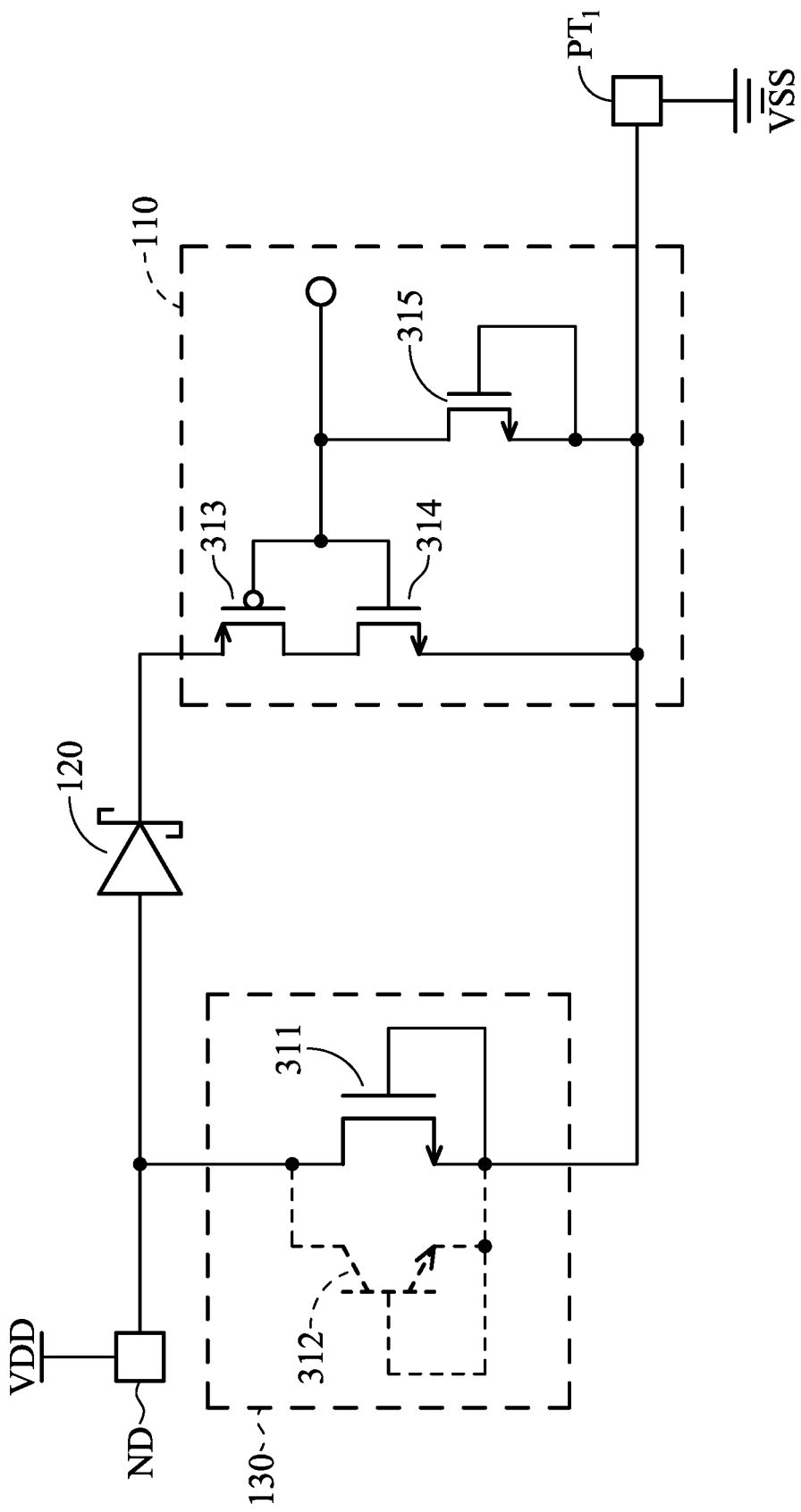
FIG. 3 is a schematic diagram of an exemplary embodiment of the ESD blocking circuit, according to various aspects of the present disclosure.

FIG. 3 is a schematic diagram of an exemplary embodiment of the ESD blocking circuit, according to various aspects of the present disclosure. In this embodiment, the specific node ND serves as a power terminal to receive the operation voltage VDD. The internal circuit 110 operates according to the operation voltages VDD and VSS. In one embodiment, the internal circuit 110 comprises a P-type transistor 313 and N-type transistors 314 and 315.

The source of the P-type transistor 313 is coupled to the cathode of the Schottky diode 120. The drain of the P-type transistor 313 is coupled to the drain of the N-type transistor 314. The source of the N-type transistor 314 is coupled to the power terminal $PT_1$. The gate of the N-type transistor 314 is coupled to the gate of the P-type transistor 313 and the drain of the N-type transistor 315. The gate and the source of the N-type transistor 315 are coupled to the power terminal $PT_1$.

When an ESD event occurs at the specific node ND and the power terminal $PT_1$ is grounded, because the Schottky diode 120 has high AC resistance, the Schottky diode 120 is capable of blocking the ESD current to prevent it from entering the internal circuit 110. This will stop the ESD current from damaging the P-type transistor 313 and the N-type transistors 314 and 315. Furthermore, since the trigger voltage of the ESD releasing element 130 is lower than the sum of the trigger voltage of the Schottky diode 120 and the trigger voltage of the internal circuit 110, the ESD releasing element 130 is turned on before the Schottky diode 120 to release the ESD current from the specific node ND to the power terminal $PT_1$.

In this embodiment, the ESD releasing element 130 comprises an N-type transistor 311. The drain of the N-type transistor 311 is coupled to the specific node ND. The gate and the source of the N-type transistor 311 are coupled to the power terminal $PT_1$. When an ESD event occurs at the specific node ND, the parasitic BJT 312 of the N-type transistor 311 is turned on such that the N-type transistor 311 is also turned on. Therefore, the ESD current passes from the specific node ND to the power terminal $PT_1$.

Figure 4:
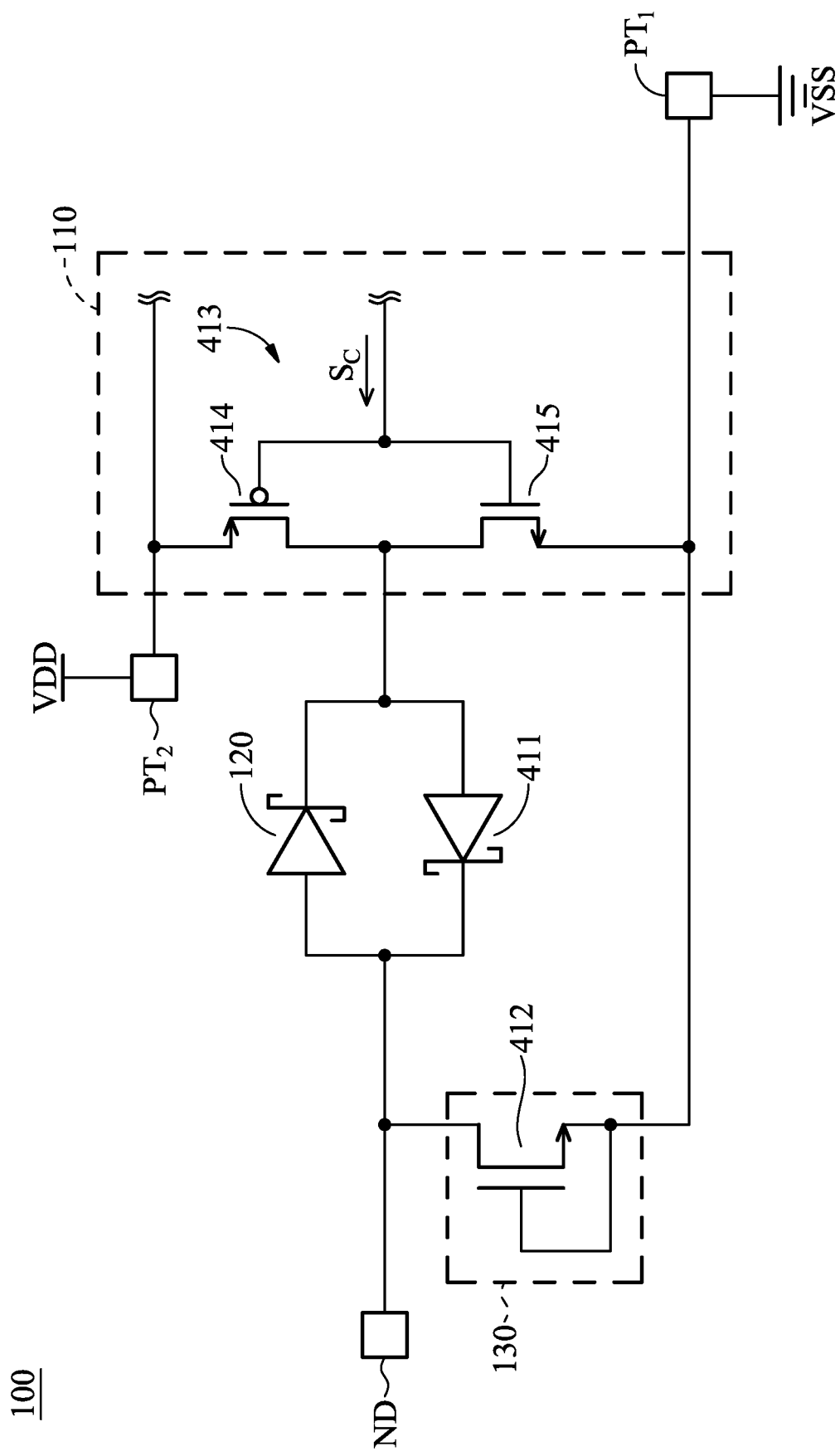
FIG. 4 is a schematic diagram of an exemplary embodiment of the ESD blocking circuit, according to various aspects of the present disclosure.

FIG. 4 is a schematic diagram of an exemplary embodiment of the ESD blocking circuit, according to various aspects of the present disclosure. In this embodiment, the specific node serves as an output node to output signals of the internal circuit 110. Since the internal circuit 110 may output the negative voltages, the ESD blocking circuit 100 further comprises a Schottky diode 411. In other embodiments, if the levels of the signals or voltages of internal circuit 110 are changed between a positive level and a ground level (e.g., 0V), the Schottky diode 411 can be omitted.

In this embodiment, the Schottky diode 411 is connected to the Schottky diode 120 in parallel. As shown in FIG. 4, the cathode of the Schottky diode 120 is coupled to the anode of the Schottky diode 411 and the output stage 413. The anode of the Schottky diode 120 is coupled to the cathode of the Schottky diode 411 and the specific node ND. When the internal circuit 110 outputs a positive level, the Schottky diode 411 is turned on. Therefore, the voltage level of the specific node ND is a positive level. However, when the internal circuit 110 outputs a negative voltage, the Schottky diode 120 is turned on. Therefore, the voltage level of the specific node ND is a negative level.

The disclosure does not limit the structure of the internal circuit 110. Any circuit can serve as an internal circuit 110, as long as the circuit is capable of outputting signals or voltages. In this embodiment, the internal circuit 110 comprises an output stage 413. The output stage 413 outputs the operation voltage VDD or VSS according to a control signal $S_C$. For example, when the control signal $S_C$ is at a first level (e.g., a high level), the output stage 413 outputs the operation voltage VSS. In one embodiment, the operation voltage VSS is a negative voltage or a ground voltage. When the control signal $S_C$ is at a second level (e.g., a low level), the output stage 413 outputs the operation voltage VDD. In one embodiment, the operation voltage VDD is a positive voltage.

In this embodiment, the output stage 413 comprises a P-type transistor 414 and an N-type transistor 415. The source of the P-type transistor 414 is coupled to the power terminal $PT_2$. The gate of the P-type transistor 414 is coupled to the gate of the N-type transistor 415 and receives the control signal $S_C$. The drain of the N-type transistor 415 is coupled to the drain of the P-type transistor 414. The source of the N-type transistor 415 is coupled to the power terminal $PT_1$.

When an ESD event does not occur, the ESD blocking circuit 100 operates in a normal mode. In the normal mode, when the power terminal $PT_1$ receives the operation voltage VSS and the power terminal $PT_2$ receives the operation voltage VDD, the output stage 413 outputs the operation voltage VSS or VDD according to the control signal $S_C$. For example, when the control signal $S_C$ turns on the P-type transistor 414, the P-type transistor 414 outputs the operation voltage VDD. Therefore, the voltage of the specific node ND is about equal to the operation voltage VDD. However, when the control signal $S_C$ turns on the N-type transistor 415, the N-type transistor 415 outputs the operation voltage VSS. Therefore, the voltage of the specific node ND is about equal to the operation voltage VSS.

When an ESD event occurs at the specific node ND and the power terminal $PT_1$ is coupled to a ground, the ESD releasing element 130 is turned on to release the ESD current from the specific node ND to the power terminal $PT_1$. In this embodiment, the ESD releasing element 130 comprises an N-type transistor 412. Since the feature of the N-type transistor 412 is the same as the feature of the N-type transistor 311 shown in FIG. 3, the description of the N-type transistor 412 is omitted.

Figure 5:
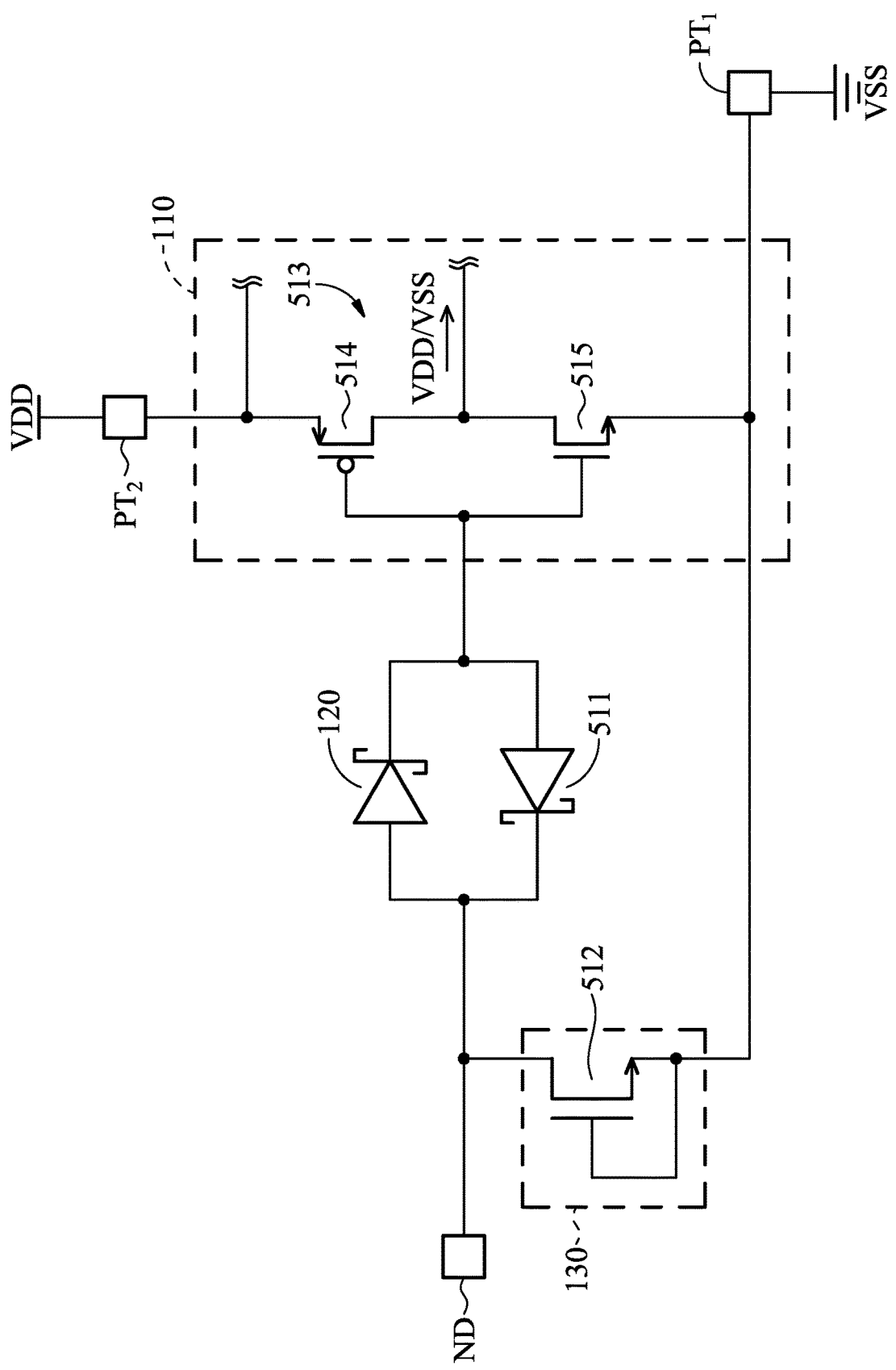
FIG. 5 is a schematic diagram of an exemplary embodiment of the ESD blocking circuit, according to various aspects of the present disclosure.

FIG. 5 is a schematic diagram of an exemplary embodiment of the ESD blocking circuit, according to various aspects of the present disclosure. In this embodiment, the specific node ND serves as an input node to provide signals or voltages to the internal circuit 110. Since the signals or the voltages received by the specific node ND may be a positive value or a negative value, the ESD blocking circuit 100 further comprises a Schottky diode 511 in this embodiment.

The Schottky diode 511 is coupled to the Schottky diode 120 in parallel. As shown in FIG. 5, the cathode of the Schottky diode 120 and the anode of the Schottky diode 511 are coupled to the input stage 513, and the anode of the Schottky diode 120 and the cathode of the Schottky diode 511 are coupled to the specific node ND. When the specific node ND receives a positive signal or voltage, the Schottky diode 120 is turned on to transmit the positive signal or voltage to the internal circuit 110. However, when the specific node ND receives a negative signal or voltage, the Schottky diode 511 is turned on to transmit the negative signal or voltage to the internal circuit 110.

The disclosure does not limit the structure of the internal circuit 110. Any circuit can serve as an internal circuit 110, as long as the circuit is capable of receiving external signals or voltages. In this embodiment, the internal circuit 110 comprises an input stage 513. The input stage 513 operates according to the voltage of the specific node ND. For example, when the level of each of the signals or voltages of the specific node ND is equal to a first level (e.g., a positive level), the input stage 513 outputs the operation voltage VSS. When the levels of each of the signals or voltage of the specific node ND is equal to a second level (e.g., a negative level), the input stage 513 outputs the operation voltage VDD. In other embodiment, when the levels of each of the signals or voltage of the specific node ND is equal to a ground level (e.g., 0V), the input stage 513 also outputs the operation voltage VDD. In some embodiment, when the signals or voltage of the specific node ND are changed between a positive level and a ground level, the Schottky diode 511 can be omitted.

In this embodiment, the input stage 513 comprises a P-type transistor 514 and an N-type transistor 515. The source of the P-type transistor 514 is coupled to the power terminal $PT_2$. The gate of the P-type transistor 514 is coupled to the gate of the N-type transistor 515 and the cathode of the Schottky diode 120. The drain of the N-type transistor 515 is coupled to the drain of the P-type transistor 514. The source of the N-type transistor 515 is coupled to the power terminal $PT_1$. In other embodiments, the drain of the N-type transistor 515 does not couple to the drain of the P-type transistor 514. In this case, the drain of the N-type transistor 515 is configured to output the operation voltage VSS, and drain of the P-type transistor 514 is configured to output the operation voltage VDD.

When an ESD event occurs at the specific node ND and the power terminal $PT_1$ is grounded, the ESD releasing element 130 is turned on to release the ESD current from the specific node ND to the power terminal $PT_1$. In this embodiment, the ESD releasing element 130 comprises an N-type transistor 512. Since the operation of the N-type transistor 512 is the same as the operation of the N-type transistor 311 shown in FIG. 3, the description of the operation of the N-type transistor 512 is omitted.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. An electrostatic discharge (ESD) blocking circuit, comprising:
   an internal circuit;
   a first Schottky diode coupled between a specific node and the internal circuit;
   a second Schottky diode coupled to the first Schottky diode in parallel; and
   an ESD releasing element coupled between the specific node and a first power terminal,
   wherein in response to an ESD event occurring at the specific node, the ESD releasing element is turned on to release an ESD current from the specific node to the first power terminal,
   wherein:

the internal circuit is further coupled to a second power terminal, in the absence of the ESD event, a voltage of the second power terminal is equal to a first operation voltage, a voltage of the first power terminal is equal to a second operation voltage, and the internal circuit operates according to the first and second operation voltages, the internal circuit comprises an output stage providing one of the first and second operation voltages to the specific node, and a cathode of the first Schottky diode and an anode of the second Schottky diode are coupled to the output stage, and an anode of the first Schottky diode and a cathode of the second Schottky diode are coupled to the specific node.

2. The ESD blocking circuit as claimed in claim 1, wherein:

the internal circuit is a one-time programmable (OTP) memory, in response to the OTP memory performing a write operation, a voltage of the specific node is equal to a first voltage, and in response to the OTP memory performing a read operation, the voltage of the specific node is equal to a second voltage which is lower than the first voltage.

3. The ESD blocking circuit as claimed in claim 1, wherein in the absence of the ESD event, a voltage of the specific node and a voltage of the first power terminal serve as operation voltages of the internal circuit.

4. The ESD blocking circuit as claimed in claim 1, wherein in response to the ESD event triggering the ESD releasing element, the first Schottky diode is not turned on.

5. The ESD blocking circuit as claimed in claim 1, wherein the ESD releasing element is an N-type transistor, and a first terminal of the N-type transistor is coupled to the specific node, and a second terminal and a control terminal of the N-type transistor are coupled to the first power terminal.

6. An electrostatic discharge (ESD) blocking circuit, comprising:

an internal circuit;

a first Schottky diode coupled between a specific node and the internal circuit;

a second Schottky diode coupled to the first Schottky diode in parallel; and an ESD releasing element coupled between the specific node and a first power terminal, wherein in response to an ESD event occurring at the specific node, the ESD releasing element is turned on to release an ESD current from the specific node to the first power terminal, wherein:

the internal circuit is further coupled to a second power terminal, in the absence of the ESD event, a voltage of the second power terminal is equal to a first operation voltage, a voltage of the first power terminal is equal to a second operation voltage, and the internal circuit operates according to the first and second operation voltages, the internal circuit comprises an input stage, and the first Schottky diode transmits a signal of the specific node to the input stage, and a cathode of the first Schottky diode and an anode of the second Schottky diode are coupled to the input stage, and an anode of the first Schottky diode and a cathode of the second Schottky diode are coupled to the specific node.

7. The ESD blocking circuit as claimed in claim 6, wherein:

the internal circuit is a one-time programmable (OTP) memory, in response to the OTP memory performing a write operation, a voltage of the specific node is equal to a first voltage, and in response to the OTP memory performing a read operation, the voltage of the specific node is equal to a second voltage which is lower than the first voltage.

8. The ESD blocking circuit as claimed in claim 6, wherein in the absence of the ESD event, a voltage of the specific node and a voltage of the first power terminal serve as operation voltages of the internal circuit.

9. The ESD blocking circuit as claimed in claim 6, wherein in response to the ESD event triggering the ESD releasing element, the first Schottky diode is not turned on.

10. The ESD blocking circuit as claimed in claim 6, wherein the ESD releasing element is an N-type transistor, and a first terminal of the N-type transistor is coupled to the specific node, and a second terminal and a control terminal of the N-type transistor are coupled to the first power terminal.

* * * * *